(12) United States Patent
Wehling et al.

(10) Patent No.: US 9,846,225 B2
(45) Date of Patent: Dec. 19, 2017

(54) ULTRASONIC SENSOR DEVICE HAVING A STIFFENING UNIT, ASSEMBLY, MOTOR VEHICLE, AND METHOD FOR PRODUCING AN ASSEMBLY

(71) Applicants: Valeo Schalter und Sensoren GmbH, Bietigheim-Bissingen (DE); Volkswagen Aktiengesellschaft, Wolfsburg (DE)

(72) Inventors: Hans-Wilhelm Wehling, Heilbronn (DE); Joerg Weyland, Brackenheim (DE); Natalie Weber, Bietigheim-Bissingen (DE)

(73) Assignees: Valeo Schalter und Sensoren GmbH, Bietigheim-Bissingen (DE); Volkswagen Aktiengesellschaft, Wolfsburg (DE)

( * ) Notice: Subject to any disclaimer, the term of this patent is extended or adjusted under 35 U.S.C. 154(b) by 338 days.

(21) Appl. No.: 14/435,211

(22) PCT Filed: Oct. 11, 2013

(86) PCT No.: PCT/EP2013/071317
§ 371 (c)(1),
(2) Date: Apr. 13, 2015

(87) PCT Pub. No.: WO2014/060317
PCT Pub. Date: Apr. 24, 2014

(65) Prior Publication Data
US 2015/0268334 A1    Sep. 24, 2015

(30) Foreign Application Priority Data
Oct. 16, 2012    (DE) .................... 10 2012 109 838

(51) Int. Cl.
*H01L 41/053*    (2006.01)
*G01S 7/521*    (2006.01)
(Continued)

(52) U.S. Cl.
CPC ............ *G01S 7/521* (2013.01); *G01S 15/931* (2013.01); *G10K 9/22* (2013.01); *H01L 41/053* (2013.01);
(Continued)

(58) Field of Classification Search
CPC ..... G01S 7/521; G01S 15/931; H01L 41/053; G01K 9/22
(Continued)

(56) References Cited

U.S. PATENT DOCUMENTS 3,842,397 A * 10/1974 Sindle ................ G01S 15/87
367/111
6,465,935 B1 * 10/2002 Wannke ................ G10K 9/122
310/324
(Continued)

FOREIGN PATENT DOCUMENTS

DE    42 38 924    5/1994
DE    197 27 877    1/1999
(Continued)

OTHER PUBLICATIONS

International Search Report & Written Opinion for International Application No. PCT/EP2013/065501, filed Oct. 11, 2013, Valeo Schalter Und Sensoren GmbH.

*Primary Examiner* — Thomas Dougherty
*Assistant Examiner* — Karen B Addison
(74) *Attorney, Agent, or Firm* — Louis Isaf; Womble Bond Dickinson (US) LLP (57) ABSTRACT

The invention relates to an ultrasonic sensor device (1) for a motor vehicle, comprising an ultrasonic sensor (2), which
(Continued)

has a membrane (5) for emitting and/or receiving ultrasonic waves, and comprising a stiffening unit (15) for attachment to a trim element (27) of the motor vehicle and for stiffening the trim element (27), wherein the stiffening unit (15) has a through-opening (17) for the membrane (5) of the ultrasonic sensor (2), wherein the stiffening unit (15) is formed from at least two separate stiffening elements (18 to 21) for attachment to a trim element (27).

13 Claims, 4 Drawing Sheets (51) Int. Cl.
  *G10K 9/22* (2006.01)
  *G01S 15/93* (2006.01)
  *H01L 41/25* (2013.01)
(52) U.S. Cl.
  CPC ........ H01L 41/25 (2013.01); *G01S 2015/938* (2013.01); *Y10T 29/42* (2015.01)

(58) Field of Classification Search
  USPC .................. 310/348, 328, 334; 367/155, 157
  See application file for complete search history.

(56) References Cited

U.S. PATENT DOCUMENTS

| | | | | |
|---|---|---|---|---|
| 7,775,110 B2* | 8/2010 | Okuda | ................... | G01H 11/08 73/627 |
| 7,832,762 B2* | 11/2010 | Breed | ................... | B60R 21/013 280/728.1 |
| 8,064,285 B2* | 11/2011 | Preissler | ............. | G01S 7/52004 367/13 |
| 2008/0089177 A1 | 4/2008 | Kojima et al. | | |

FOREIGN PATENT DOCUMENTS

| | | |
|---|---|---|
| DE | 10 2007 045 809 | 6/2008 |
| DE | 10 2008 018 110 | 10/2008 |
| DE | 10 2008 062 011 | 6/2010 |
| DE | 10 2010 044 996 | 3/2012 |
| GB | 2 272 819 | 5/1994 |

* cited by examiner

ULTRASONIC SENSOR DEVICE HAVING A STIFFENING UNIT, ASSEMBLY, MOTOR VEHICLE, AND METHOD FOR PRODUCING AN ASSEMBLY

CROSS-REFERENCE TO RELATED APPLICATIONS

The present invention claims priority to German Patent Application Number 10 2012 109 838.7, filed Oct. 16, 2012.

STATEMENT REGARDING FEDERALLY SPONSERED RESEARCH OR DEVELOPMENT

Not Applicable

THE NAMES OF PARTIES TO A JOINT RESEARCH AGREEMENT

Not Applicable

INCORPORATION-BY-REFERFENCE OF MATERIAL SUBMITTED ON A COMPACT DISC OR AS A TEXT FILE VIA THE OFFICE ELECTRONIC FILING SYSTEM (EFS-WEB)

Not Applicable

BACKGROUND OF THE INVENTION

Ultrasonic sensors are already prior art and can be mounted in known manner in the front region and in the rear region of a motor vehicle, namely for instance at the respective bumpers. The ultrasonic sensors are assigned to driver assistance devices and provide information about the environment of the vehicle, and more precisely about the distances between the motor vehicle, on the one hand, and the obstacles present in its environment, on the other hand. Driver assistance devices in this connection may for instance be parking assistance systems, systems for dead angle monitoring, headway control systems, braking assistance systems, collision detection systems, and the like.

It is already prior art that such ultrasonic sensors are built into bumpers in uncovered arrangement. This means that the ultrasonic sensors are arranged in open recesses or through-openings in the bumper and are visible on the outside. Here the pot-shaped membrane of the ultrasonic sensor—the so-called aluminum pot—extends through the through-opening of the bumper so that a front side or a front surface of the membrane is flush with the outer surface of the bumper. The front side of the membrane here may be varnished for instance in the color of the bumper. For vibration isolation of the membrane from the bumper commonly a decoupling ring made from a soft material is used, which is arranged around the membrane and fits around an outer circumference of the pot-shaped membrane. This decoupling ring is for instance formed from silicon.

BRIEF SUMMARY OF THE INVENTION

The invention relates to an ultrasonic sensor device for a motor vehicle, comprising an ultrasonic sensor, which has a membrane for emitting and/or receiving ultrasonic waves, as well as comprising a stiffening unit for attachment to a trim element of the motor vehicle and for stiffening the trim element, wherein the stiffening unit forms a through-opening for the membrane of the ultrasonic sensor so that in particular the membrane can be pushed through this through-opening and be brought to fit against the rear side of the trim element. The invention moreover relates to an arrangement for a motor vehicle, comprising a trim element, in particular a bumper, and comprising such ultrasonic sensor device. Moreover, the invention relates to a motor vehicle having such an arrangement, as well as to a method for manufacturing an arrangement.

In the present case the interest is focused on an uncovered arrangement of an ultrasonic sensor, as it is already known for instance from the document DE 42 38 924 A1 or from the document DE 10 2008 018 110 A1. In such a concealed arrangement the ultrasonic sensor is arranged concealed behind the bumper so that the front side of the pot-shaped membrane fits against a back side of the bumper, which faces the interior of the vehicle. The ultrasonic waves thus are emitted and received through the material of the bumper. Here a suitable holder needs to be employed in order to be able to fasten the membrane or the complete ultrasonic sensor including the membrane to the back side of the bumper. In this connection it is already known that such a holding device (in particular via a stiffening element) can be connected with the bumper via a glue, whilst the ultrasonic sensor itself can be connected with the holding device in a reversibly releasable manner (and in a non-destructive releasable manner).

In the case of the ultrasonic sensors in concealed arrangement, thus, the membrane is arranged behind the bumper and in particular rests directly against the back side of the bumper. The ultrasonic signals are emitted and received through the material of the bumper. This means that also a certain portion of the bumper covibrates. This vibrating portion of the bumper is to be delimited with the aid of a stiffening unit formed from a stiff material—for instance from ceramics—which in the prior art is provided in the form of a single stiffening element. The stiffening unit is intended to reduce the vibration of the bumper to a portion corresponding in size to the diameter of the membrane. The vibrating surface of the bumper, accordingly, should only be as large as the diameter of the membrane of the ultrasonic sensor. For this very reason the stiffening unit made from a stiff material is employed around the membrane or around the above-named decoupling ring, which is made from a soft and elastic material, and is designed to be ring-shaped and surrounds the membrane around its outer circumference. This means that the above-named decoupling ring can possibly be arranged between the membrane, on the one hand, and the stiffening unit, on the other hand.

The stiffening unit as a matter of principle can only fulfil its function if it is with its full surface mechanically fixed to the back side of the bumper. Only in the case of a complete surface fixed connection of the stiffening unit it is ensured that no undesired high vibrations are transferred to the remaining portion of the bumper. Relatively raised requirements are made as to the connection between the bumper and the stiffening unit: The connection must last for the entire service life of the vehicle as well as over the entire temperature range of −40° C. to +90° C. For this reason commonly an adhesive is used, which meets the requirements as to adhesion, temperature resistance, low aging, low stiffness loss over temperature, low layer thickness, as well as little water absorption.

It has turned out that due to the vibration of the stiffening element in the adhesive connection micro fissures may occur, which lead to local de-adhesions of the connection. Thus, local adhesion problems occur so that the vibrating surface of the bumper can no longer be reliably restricted to the size of the membrane. Such fissures for instance can occur due to a bad adhesion for instance because of uncleaned adhesion surfaces. The occurrence of such fissure additionally is supported by large differences in the length expansion coefficient between the stiffening element and the bumper. It has also turned out that during operation of the vehicle a vibration of the stiffening unit with a relatively large vibration amplitude may occur. This vibration is then transferred to the bumper so that the bumper, too, vibrates outside of the outer diameter of the stiffening element and thus a sound radiation towards the back or in the direction towards the vehicle body occurs. These sound waves then reflect in the vehicle body parts and from the rear portion return to the sensor, namely as interference echo or false echo. Thus, in the prior art additional measures for suppressing the rear interference echo must be taken.

It is the task of the invention to present a solution as how to allow for a reliable stiffening of the trim element by means of a stiffening unit in an ultrasonic sensor device of the initially mentioned kind.

According to the invention this task is solved by an ultrasonic sensor device, by an arrangement, as well as by a motor vehicle, and by a method having the features according to the respective independent patent claims. Advantageous embodiments of the invention are subject matter of the dependent patent claims, the description, and the figures.

According to the invention an ultrasonic sensor device for a motor vehicle comprises an ultrasonic sensor, which has a membrane for emitting and/or receiving ultrasonic waves, as well as comprises a stiffening unit for attachment to a trim element of the motor vehicle and for stiffening the trim element, namely in particular for delimiting a mechanical vibration of the trim element essentially to the size of the membrane. The stiffening unit in the assembled state has a through-opening for the membrane of the ultrasonic sensor. The stiffening unit is subdivided into at least two separate stiffening elements and thus designed to be segmented, wherein the separate stiffening element are designed for attachment to the trim element and for stiffening the trim element around the membrane.

Thus, the invention, rather than using a single-piece stiffening unit in the form of a stiffening ring, takes the path of subdividing the stiffening unit—in particular with the overall size remaining essentially the same—into at least two stiffening elements or stiffening parts, which are provided separate from each other and are arranged at a small distance from each other, for instance at a distance smaller than 3 mm, in particular smaller than 2 mm. It namely has turned out that an integrally formed stiffening unit in combination with the material of the trim element (such as with polypropylene plastics) over the prescribed operating temperature of −40° C. to +90° C. tends to different vibration modes. Depending on the vibration mode of the stiffening unit, then a more or less strong vibration of the trim element around the outer diameter of the stiffening unit is rendered. These vibrations occurring external to the outer diameter of the stiffening unit then cause a propagation of the ultrasonic waves in the direction towards the interior of the vehicle so that the ultrasonic waves reflect on the vehicle elements and return as rear echo back to the ultrasonic sensor. Thus, in the prior art additionally attenuation measures need to be taken, which serve for the attenuation of the sound radiation towards the back in the direction of the vehicle body. Higher vibrations can only occur if the stiffening unit is formed as a single piece. In order to minimize this radiation of ultrasonic waves in the direction towards the vehicle interior, the stiffening unit is subdivided into several individual parts.

Thus, on the one hand, it is ensured that the function of the stiffening unit—namely the stiffening of the trim element—is further maintained by the used work material as well as by the mechanical connection with the trim element. On the other hand, however, it is additionally achieved that the individual stiffening elements with regard to their geometry can no longer bend out of shape as much as does a single-piece stiffening ring and produce crucial vibration modes depending on frequency. This is because individual stiffening elements are clearly more stable, because taken individually they are clearly smaller in comparison with a single-piece stiffening ring in the surface in parallel to the trim element. In other words, the vibration amplitude of the individual small stiffening elements is clearly smaller than the vibration amplitude of a single-piece stiffening ring so that also a lower vibration is transferred to the trim element. A further advantage consists in the fact that the properties of the stiffening unit with regard to further requirements—such as in particular the fade out vibration time, the directionality and the like—have remained maintained. Consequently, the invention has the advantage that possibly additional measures for the suppression of sound propagation towards the back in the direction towards the vehicle interior can be done without so that for instance the employment of a cap or the employment of additional soft attenuation mats with the involved disadvantages can possibly be unnecessary. This applies preferably only in connection with certain materials of the trim element, such as in particular the modified polypropene with the designation "BMU 130".

The invention consequently makes use of the fact that larger vibrations or larger vibration amplitudes can form in a structure exclusively in the region of the natural frequency due to an external energy supply. Whilst in the prior art the stiffening unit designed as a single-piece ring with regard to the used material and the geometrical dimensions is configured in such a way that it has no natural resonances, if possible, in the region of the operation frequency of the ultrasonic sensor, and thus no larger vibration amplitudes of the stiffening unit are possible, however, nevertheless in the case of external energy supply high vibration amplitudes and thus vibration modes can form. In the case of an ultrasonic sensor, which is concealed behind the trim element, the operation frequency namely is considerably determined by the electricity module of the trim element. In particular in the case of plastics this electricity module is strongly dependent on the temperature. The stiffening unit therefore needs to be designed over a large frequency range—namely from 30 kHz to 100 kHz—in such a way that it can absorb as little vibration energy as possible and thus no higher vibration modes can form. The invention now is based on the insight that the vibration amplitudes in the case of a single-piece design of the stiffening unit are clearly higher than in the case of a segmented stiffening unit or a stiffening unit having several stiffening elements.

The stiffening unit has a through-opening for the membrane of the ultrasonic sensor. This means that in the assembled or in the mounted state the ultrasonic sensor device is arranged around the—in particular pot-shaped—membrane of the ultrasonic sensor and thus extends to surround same membrane on its outer circumference. Between the membrane, on the one hand, and the stiffening unit, on the other hand, there is preferably a decoupling ring formed from a soft-elastic material, the decoupling ring being in contact with a circumference of the pot-shaped membrane thus coating the membrane on its outer circumference. The stiffening unit thus is a unit that is different from such a decoupling ring or a separate unit.

Preferably, at least two stiffening elements are arranged spaced apart from each other.

In general, the stiffening unit can be subdivided in the circumferential direction and/or in the radial direction each into at least two stiffening elements. In one embodiment it is consequently envisaged that in the circumferential direction the stiffening unit is subdivided into at least two stiffening elements, which in the circumferential direction are arranged to be spaced apart from each other or at a small distance from each other. Preferably, these stiffening element are configured in the form of ring sectors. The stiffening unit preferably comprises at least one ring structure, which is subdivided in the circumferential direction into at least two ring sectors as stiffening elements. Thus, on the whole smaller stiffening elements can be provided so that the vibration amplitude of the individual stiffening elements over the entire demanded temperature range is very low. In this connection it basically applies that the more such stiffening elements are provided or the smaller the stiffening elements are, the smaller is the maximum vibration amplitude of the stiffening elements and thus the lower is the energy of the ultrasonic waves radiating backwards.

Additionally or alternatively the stiffening unit in the radial direction may also have two concentrically arranged ring structures, which are arranged spaced apart from each other in the radial direction. In the case of a predetermined overall size of the stiffening unit thus the size of the individual stiffening elements and thus the maximum possible vibration amplitude can thus be further reduced.

If the stiffening unit is subdivided both in the circumferential direction as well as in the radial direction, at least one of the ring structures in the circumferential directions can be subdivided into at least two ring sectors as stiffening elements, which are arranged spaced apart from each other in the circumferential direction. The subdivision of the stiffening unit both in the circumferential direction as well as in the radial direction is particularly advantageous in particular in the case of a trim element, the material of which has an electricity module, which is particularly heavily depends on temperature. By the subdivision of the stiffening unit both in the circumferential direction as well as in the radial direction namely a stiffening unit is created, which over a very wide frequency range as well as over a large temperature range can absorb very low vibration energy and thus cannot be excited to produce any large vibration.

If at least two such concentric ring structures in the circumferential direction are each subdivided into at least two ring sectors or stiffening elements, the stiffening elements of a first ring structure can be arranged to be offset by an angle from the stiffening elements of the adjacent second ring structure. This means that the slots, which are formed between the stiffening elements adjacent to each other in the circumferential direction, of the first ring structure, on the one hand, and of the second ring structure, on the other hand, are arranged in different angle positions relative to each other.

Alternatively, however, it can also be envisaged that the stiffening elements of the first ring structure, on the one hand, and that of the second ring structure, on the other hand, are arranged in same angle positions relative to each other. This means that the named slots of the first ring structure, on the one hand, and that of the second ring structure, on the other hand, are in same angle positions.

Preferably, by the stiffening unit on the whole a ring shape is formed or the stiffening unit on the whole has a ring shape, which is subdivided in the circumferential direction and/or in the radial direction into at least two stiffening elements.

Thus, on the one hand, the through-opening for the membrane of the ultrasonic sensor is provided. On the other hand, such a ring-shaped stiffening unit can also be integrated without much effort into the already existing or for single-piece stiffening elements already developed holding means, which serve for fastening the ultrasonic sensor to the trim element of the motor vehicle. For instance, the stiffening unit can be glued together with the holding means, wherein the geometric shape of the holding means need not be additionally adapted to the stiffening unit.

Particularly preferably, the at least two stiffening elements are formed from the same or from a uniform material, namely for instance from ceramics or from a different stiff material. Then the stiffening effect is uniform for the entire surface of the trim element, which is brought into contact with the stiffening unit.

The provision of the at least two stiffening elements, however, also allows for at least two stiffening elements (of the at least two stiffening elements) to be made from different materials. Thus, the stiffening effect can be varied over the surface of the trim element depending on the requirements. Even in the case of different materials, however, it is preferably envisaged that these different materials are ceramic materials, which are particularly stiff.

This means that the at least two stiffening elements are in particular made from ceramics. The invention, however, is not restricted to such specific material, and also other materials may be employed, which have a similar stiffness or firmness. At least one of the stiffening elements in this connection can be formed from aluminum oxide and/or from silicon carbide. It namely has turned out that these materials are sufficiently stiff/rigid for the stiffening of a trim element of a motor vehicle.

In order to reduce the manufacturing effort, the at least two stiffening elements can be connected with each other via a side bar, which is formed from a less stiff material than is the material of the stiffening unit. Thus, the handling of the stiffening unit requires particularly little effort, because all stiffening elements can at the same time also be handled in a stable manner. In particular the side bar is formed from a non-stiffening and preferably from a soft material, by which the at least two stiffening elements are decoupled from each other in terms of vibration. This means in particular that no stiff/rigid—in particular no ceramic—connection between the individual stiffening elements is envisaged and the side bar merely is to simplify the mounting of the ultrasonic sensor device in terms of manufacture. The side bar thus does not contribute to the stiffening of the trim element and consequently is not a component of the stiffening unit.

Preferably, the ultrasonic sensor device has a holder, which is connected with the stiffening unit and to which the ultrasonic sensor is capable of being fastened, in particular in a non-destructive reversibly releasable manner. The holder may for instance be glued together with the stiffening unit. The releasable connection between the ultrasonic sensor and the holding device can in particular be designed as latch-in connection. Such a holder has in particular the advantage that the ultrasonic sensor alone can be released from the trim element, without also having to release the holder or else the stiffening unit together with the ultrasonic sensor. In case of repair or exchange of the ultrasonic sensor the effort involved with dismounting of the ultrasonic sensor thus is kept to a minimum.

The stiffening unit is preferably connected, in particular glued together, with its front side to the rear side of the trim element. The rear side of the stiffening unit, however, is connected with, in particular glued together with, the holder.

Alternatively the stiffening unit can also be connected by a latch-in connection with the holder.

The holder preferably has a through-opening, through which the membrane of the ultrasonic sensor is pushed in order to be brought in contact with the rear side of the trim element.

According to the invention, an arrangement for a motor vehicle comprises a trim element, in particular a bumper, and an ultrasonic sensor device, which is arranged on a rear side of the trim element, wherein the ultrasonic sensor is designed for emitting and/or receiving ultrasonic sensor waves through the trim element and the stiffening unit is arranged to fit against the rear side of the trim element. Preferably also the front side of the membrane fits against the rear side of the trim element, in particular with its complete surface.

The rear side of the trim element is the side which faces towards the interior of the vehicle and thus is not visible from the outside.

The invention also relates to a motor vehicle comprising an arrangement according to the invention.

A method according to the invention serves for manufacturing an arrangement for a motor vehicle by providing a trim element, in particular a bumper, by providing an ultrasonic sensor with a membrane for emitting and/r receiving ultrasonic waves, and by providing a stiffening unit and attaching the stiffening unit to a rear side of the trim element, wherein the stiffening unit has a through-opening, through which the membrane is pushed through. The stiffening unit is formed from at least two separate stiffening elements in a segmented manner.

The preferred embodiments presented with reference to the ultrasonic sensor device according to the invention and their advantages in analogy apply to the arrangement according to the invention, to the motor vehicle according to the invention, as well as to the method according to the invention.

Further features of the invention may be gathered from the claims, the figures, and the description of the figures. All features and feature combinations previously mentioned in the description as well as the features or feature combinations shown in the following in the description of the figures and/or shown in the figures alone can be used not only in the respective indicated combination, but also in any other combination or else taken alone.

The invention in the following is explained in more detail by reference to individual preferred embodiments, as well as by referring to the enclosed drawings.

DETAILED DESCRIPTION OF THE INVENTION

Figure 1:
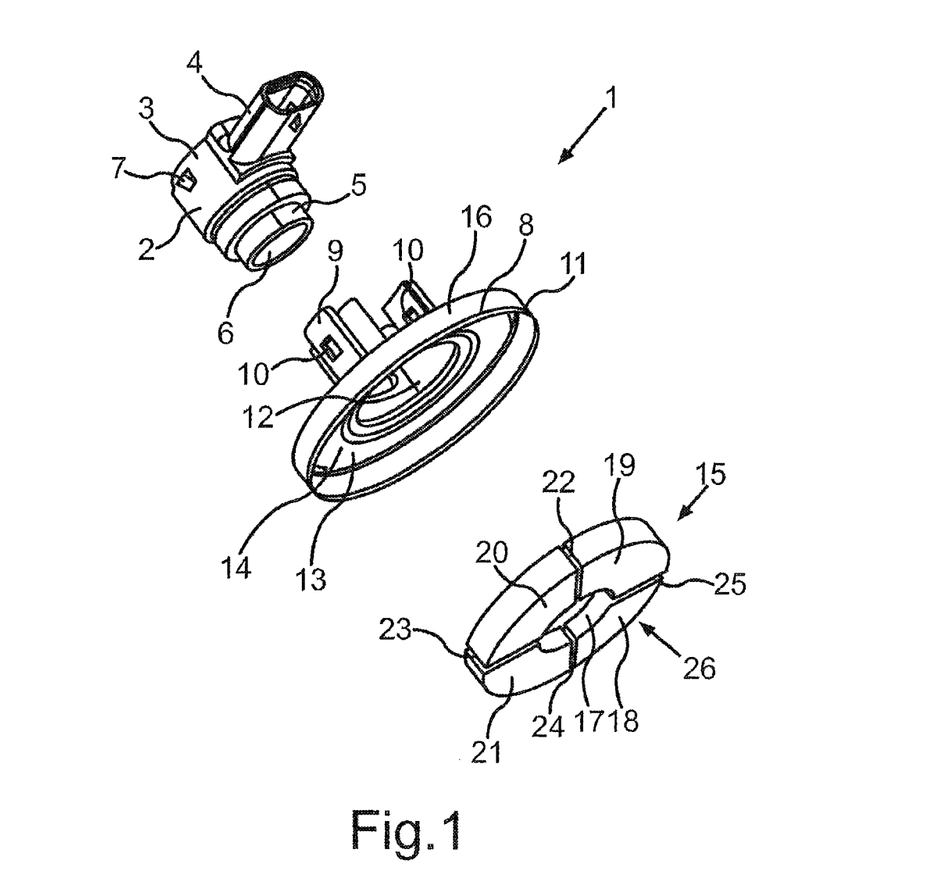
FIG. 1 is a schematic and perspective view of an ultrasonic sensor device according to an embodiment of the invention.

In FIG. 1 a schematic view of an ultrasonic sensor device 1 according to an embodiment of the invention is shown.

The ultrasonic sensor device 1 comprises an ultrasonic sensor 2, which has a sensor housing 3 with a plug 4 that serves for connecting the sensor 2 with an electronic control device of a motor vehicle. From the cylindrical sensor housing 3 protrudes a pot-shaped membrane 5, which is configured for emitting and receiving ultrasonic signals or ultrasonic waves. The membrane 5 is designed to have the shape of a pot and to be made for instance from aluminum. It has a front side 6, through which the ultrasonic waves are sent out. The mechanical excitation of the front side 6 can for instance be effected with the aid of a piezoelectric element, which is placed in the interior of the membrane 5 upon a bottom of the membrane 5, which is opposite the front side 6.

On the sensor housing 3 latch elements 7 are formed, via which the ultrasonic sensor 2 can be attached to a holder 8 in a non-destructive reversibly releasable manner. The holder 8 is designed as a single piece and has a receiving duct 9, in which corresponding latch openings or latch lugs 10 are formed, into which the latch elements 7 can latch into place. The holder 8 moreover has a base 11, which is arranged concentrically to the cylinder-shaped receiving duct 9 and equally is of cylindrical design and has a larger diameter than the receiving duct 9. The holder 8 has a central through-opening 12, through which the membrane 5 pushes in the mounted state, in order to be able to fit against a trim element of the motor vehicle.

On its front side or frontal face, which faces away from the ultrasonic sensor 2, the base 11 has a receptacle 13 with a bottom 14, into which a stiffening unit 15 formed from a stiff material can be inserted. The receptacle 13 is laterally bounded by a circumferential side bar 16, on the inner circumference of which possibly latch structures for catching the stiffening unit 15 can be integrally formed.

Also the stiffening unit 15 has a through-opening 17, through which the membrane 5 extends in the mounted state.

In the embodiment according to FIG. 1 it is envisaged that the stiffening unit 15 on the whole has the shape of a ring and thus forms a single ring structure with the through-opening 17. The stiffening unit 15 in this connection is subdivided in the circumferential direction into a total of four equal ring sectors or stiffening elements 18, 19, 20, 21, which are arranged in the circumferential direction at a small distance from each other. In the circumferential direction thus slots 22 to 25 are formed between the individual stiffening elements 18 to 21, which extend in a straight line in the radial direction. The individual stiffening elements 18 to 21 thus do not touch each other.

In the example according to FIG. 1 the stiffening unit 15 has a single such ring structure with four stiffening elements 18 to 21. However, also several of such ring structures can be provided, which are arranged concentrically to each other and each are for instance subdivided into several stiffening elements in the circumferential direction.

The stiffening elements 18 to 21 are for instance all formed from the same material. Merely as an example be ceramic material, such as for instance aluminum oxide and/or silicon carbide, named at this point.

The stiffening unit 15 serves for stiffening a trim element of the motor vehicle, such as the bumper, at which the ultrasonic sensor device is attached. The stiffening unit 15 has a front side 26, which is connected with, in particular glued together with, the rear side of the trim element. On the other hand, the stiffening unit 15 is received in the receptacle 13 of the holder 8 and connected with the bottom 14 and/or the side bar 16. Here, too, an adhesive bond can be envisaged. Additionally or alternatively for this purpose latch elements can also be provided.

The holder 8 consequently is attached via the stiffening unit 15 to the rear side of the trim element. The ultrasonic sensor 2 in this connection can be attached in a simple and reversibly releasable manner via the latch elements 7 to the holder 8. Merely the front side 6 of the membrane 5 can be connected via a suitable adhesive with the rear side of the trim element.

Figure 2:
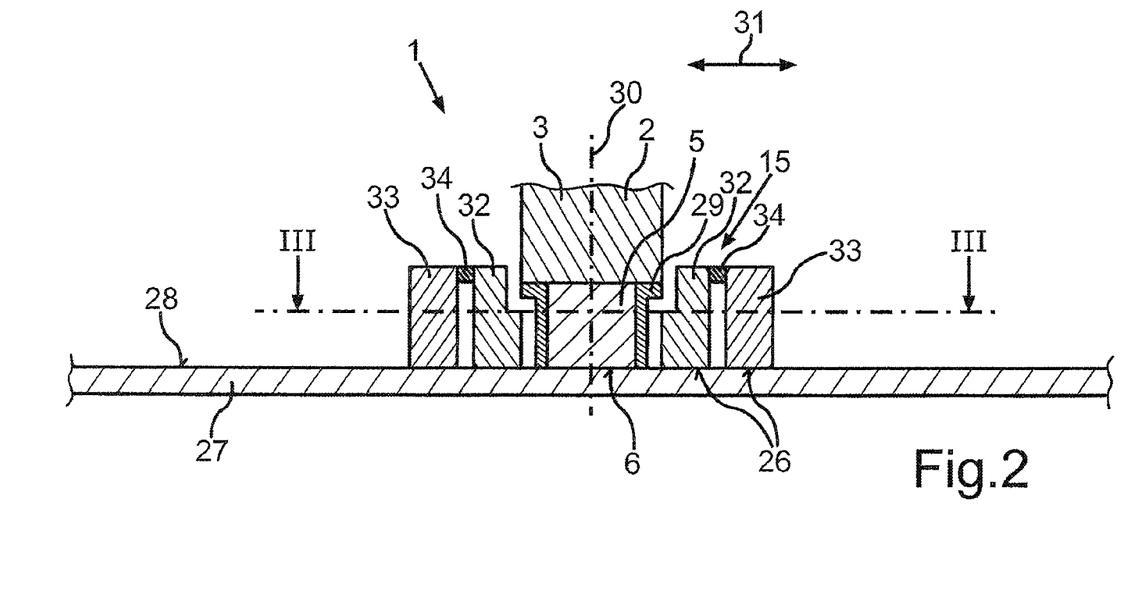
FIG. 2 is a schematic sectional view of an arrangement according to an embodiment of the invention.

An arrangement according to an embodiment of the invention is shown in a sectional view in FIG. 2. The arrangement comprises a trim element 27 of the motor vehicle, such as a bumper. On a rear side 28 of the trim element 27 facing the interior of the vehicle the ultrasonic sensor device 1 is attached. The holder 8 in this connection is not shown.

The front side 6 of the membrane 5 lies directly against the rear side 28 of the trim element 27. Around the membrane 5 a decoupling ring 29 is arranged, which is formed from a soft-elastic material, such as silicon. This decoupling ring 29 is put on the pot-shaped membrane 5 and with its outer circumference lies against the membrane 5. The front side 6 of the membrane 5 is devoid of such a decoupling ring 29.

So the ultrasonic sensor 2 sends the ultrasonic waves through the material of the trim element 27. The sensor axis or longitudinal axis of the ultrasonic sensor 2 is designated in FIG. 2 with 30. The main capture direction of the ultrasonic sensor 2 is defined along this sensor axis 30.

Around the decoupling ring 29 there is the stiffening unit 15. In this embodiment the stiffening unit 15 is also subdivided in the radial direction 31 and in total contains two concentrically arranged ring structures 32, 33. The ring structures 32, 33 are arranged spaced apart from each other in the radial direction 31. Each ring structure 32, 33 is subdivided into at least two ring sectors or stiffening elements, namely in the circumferential direction. Possibly, merely one of the ring structures 32, 33 can be subdivided, whilst the other ring structure 32, 33 can form a continuous circumferential ring.

The stiffening unit 15 is attached with its front side 26 contacting the rear side 28 of the trim element 27 and is for instance glued together with the rear side 28.

The stiffening elements of the respective ring structures 32, 33 on the side facing away from the trim element 27 can be connected with each other via a thin side bar 34, which renders the mounting of the ultrasonic sensor device 1 essentially easier. The side bar 34 in this connection has no stiffening function and is formed preferably from a clearly softer material than is the stiffening unit 15, namely for instance from silicone or else from plastics. This means that the side bar 34 does not change the fact that the individual stiffening elements or the individual ring structures 32, 33 do not touch each other.

Figure 5:
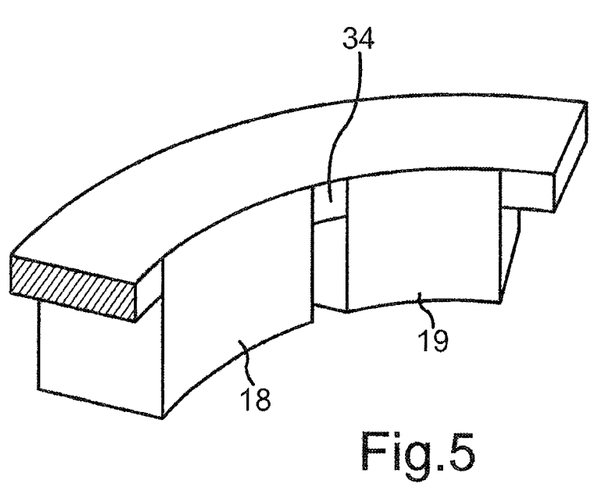
FIG. 5 is a schematic and perspective view of a ring structure of a stiffening unit.

Such a side bar 34 can also be provided between two adjacent stiffening elements 18, 19 of one and the same ring structure 32, 33, as is shown by an example in FIG. 5. Here the two adjacent stiffening elements 18, 19 are connected via such a side bar 34 with each other in the circumferential direction and thus can be handled together.

Figure 3:
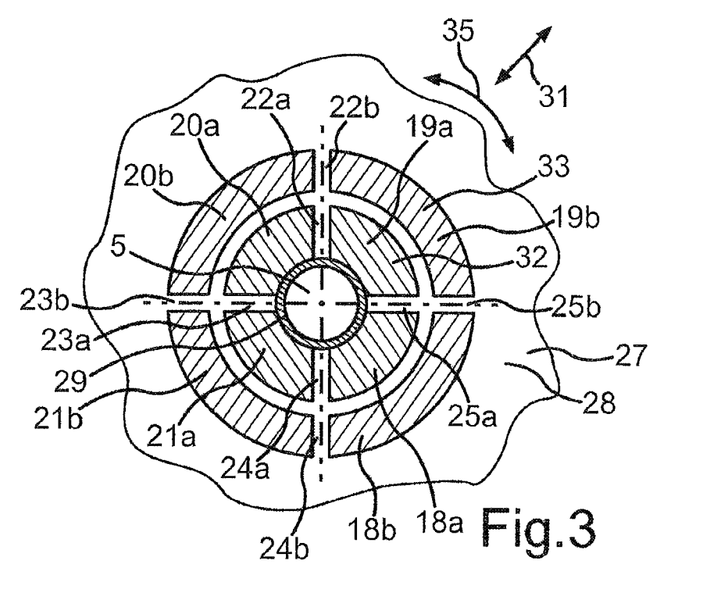
FIG. 3 is a schematic top or sectional view of a stiffening unit according to a first embodiment.

In FIG. 3 a top view or a sectional view of the arrangement according to FIG. 2 along the line III-III is shown together with the rear side 28 of the trim element 27. As can be gathered from FIG. 3, the two ring structures 32, 33 each are also subdivided in the circumferential direction 35 into four stiffening elements 18a to 21a or 18b to 21b, wherein the stiffening elements 18 to 21 each form a quarter of the respective ring structure 32, 33.

Between two in the circumferential direction adjacent stiffening elements 18 to 21 each a slot 22a to 25a or 22b to 25b is formed. These slots extend in a straight line in the radial direction 31. The two ring structures 32, 33 in the embodiment according to FIG. 3 relative to each other are arranged in such a way that the respective stiffening elements 18a to 21a, on the one hand, as well as 18b to 21b, on the other hand, are arranged in the same angle positions relative to each other. Thus, also the respective slots 22a to 25a, on the one hand, as well as 22b to 25b, on the other hand, concur in the same angle positions.

Figure 4:
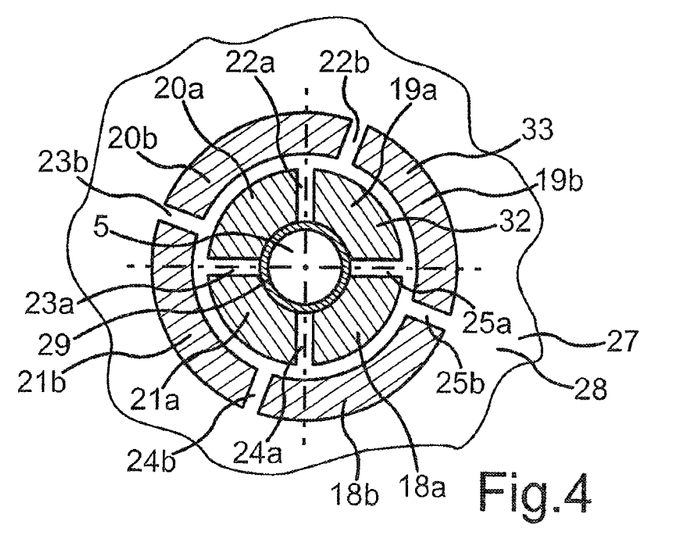
FIG. 4 is a schematic top or sectional view of a stiffening unit according to a second embodiment.

By contrast, in FIG. 4 an embodiment is shown, in which the stiffening elements 18a to 21a of the inner ring structure 32 are arranged to be offset by an angle from the stiffening elements 18b to 21b of the outer ring structure 33. Thus, also the respective slots 22a to 25a, on the one hand, as well as 22b to 25b, on the other hand, no longer concur, but are arranged in different angle positions relative to each other.

The number of the stiffening elements 18 to 22 as well as their arrangement relative to each other is shown in the figures merely in an exemplary way and may vary depending on the embodiment.

The outer diameter of the entire stiffening unit 15 essentially corresponds to the diameter of the circumferential side bar 16 of the holder 8 or is slightly smaller than it (see FIG. 1). Irrespective of the number of concentric ring structures 32, 33 the outer diameter of the entire stiffening unit 15 preferably remains the same so that the more stiffening elements re provided, the smaller are these stiffening elements.

The stiffening unit 15 on the one hand prevents the formation of larger vibration amplitudes of the trim element 27. On the other hand, the stiffening unit 15 also passes on part of the kinetic energy introduced into it on to the trim element 27. For this reason the energy introduced into the stiffening unit 15 should be kept to a minimum. In the case of a single-piece design of a stiffening unit in the prior art more kinetic energy is introduced into this stiffening ring than is the case of a segmented stiffening unit 15 according to the invention. This is because in the case of an integrally formed stiffening unit 15 the respective vibration mode can propagate over the entire circumference and thus a greater length. By the suggested segmentation the introduced kinetic energy will mainly propagate within the individual segments and the respective vibration mode cannot expand over the entire circumference. By this reduced introduction of kinetic energy into the stiffening unit 15 thus also less kinetic energy is introduced into the trim element 27, which leads to a reduction of the undesired vibrations of same trim element 27 and thus to a reduction of the undesired sound propagation towards the back. A single stiffening element 18 to 21 is moreover also rendered clearly stiffer by the suggested segmentation, namely owing to the on the whole smaller length/height ratio.

The invention claimed is:

1. An ultrasonic sensor device for a motor vehicle, comprising an ultrasonic sensor, which comprises a membrane for emitting and/or receiving ultrasonic waves, and comprising a stiffening unit for attachment to a trim element of the motor vehicle and for stiffening the trim element, wherein the stiffening unit has a through-opening for the membrane of the ultrasonic sensor, characterized in that
the stiffening unit has at least two separate stiffening elements, which are configured for attachment to the trim element and for stiffening the trim element, wherein at least two stiffening elements are formed from different materials.

2. The ultrasonic sensor device according to claim 1, characterized in that
in the circumferential direction the stiffening unit is subdivided into at least two stiffening elements, which are arranged spaced apart from each other in the circumferential direction.

3. The ultrasonic sensor device according to claim 1, characterized in that
in the radial direction the stiffening unit has at least two concentrically arranged ring structures, which are arranged spaced apart from each other in the radial direction.

4. The ultrasonic sensor device according to claim 3, characterized in that
at least one of the ring structures in the circumferential direction is subdivided into at least two ring sectors as stiffening elements, which are arranged spaced apart from each other in the circumferential direction.

5. The ultrasonic sensor device according to claim 1, characterized in that
by the stiffening unit on the whole a ring shape is formed.

6. The ultrasonic sensor device according to claim 1, characterized in that
at least two stiffening elements are formed from the same material.

7. The ultrasonic sensor device according to claim 1, characterized in that
at least one of the stiffening elements is formed from ceramics, in particular from aluminum oxide and/or silicon carbide.

8. The ultrasonic sensor device according to claim 1, characterized in that
the at least two stiffening elements are connected with each other via a side bar, which is formed from a material that is less stiff than the material of the stiffening unit.

9. The ultrasonic sensor device according to claim 8, characterized in that
the side bar is formed from silicon and/or from plastics.

10. The ultrasonic sensor device according to claim 1, characterized in that the ultrasonic sensor device has a holder, which is connected to the stiffening unit, to which the ultrasonic sensor is capable of being fastened, in particular in a reversibly releasable manner.

11. An arrangement for a motor vehicle, comprising a trim element, a stiffening unit for stiffening the trim element, and an ultrasonic sensor arranged at a rear side of the trim element, wherein the ultrasonic sensor is designed for emitting and/or receiving ultrasonic waves through the trim element and the stiffening unit is attached to fit against the rear side of the trim element, the stiffening unit comprising at least two separate stiffening elements attached to and stiffening the trim element, wherein at least two stiffening elements are formed from different materials.

12. A motor vehicle comprising an arrangement according to claim 11.

13. A method for manufacturing an arrangement for a motor vehicle by providing a trim element , in particular a bumper, providing an ultrasonic sensor comprising a membrane for emitting and/or receiving ultrasonic waves, and providing a stiffening unit and attaching the stiffening unit to a rear side of the trim element, wherein the stiffening unit has a through-opening, through which the membrane is pushed through,
characterized in that
the stiffening unit is formed from at least two separate stiffening elements, wherein at least two stiffening elements are formed from different materials.

* * * * *